United States Patent [19]

Weinberg

[11] Patent Number: 5,002,010
[45] Date of Patent: Mar. 26, 1991

[54] VACUUM VESSEL

[75] Inventor: Richard S. Weinberg, Palo Alto, Calif.

[73] Assignee: Varian Associates, Inc., Palo Alto, Calif.

[21] Appl. No.: 423,802

[22] Filed: Oct. 18, 1989

[51] Int. Cl.⁵ .............................................. C23C 16/00
[52] U.S. Cl. ................................... 118/719; 118/724; 118/725
[58] Field of Search ...................... 118/719, 724, 725; 414/217; 204/298.25, 298.35; 156/345

[56] References Cited

U.S. PATENT DOCUMENTS

| | | | |
|---|---|---|---|
| 3,505,974 | 4/1970 | Barker | 118/48 |
| 3,568,632 | 3/1971 | Cawthon | 118/49 |
| 3,915,117 | 10/1975 | Schertler | 118/49 |
| 4,224,897 | 8/1980 | Dugdale | 118/719 |
| 4,313,783 | 2/1982 | Davies | 156/345 |
| 4,338,883 | 7/1982 | Mahler | 118/719 |
| 4,534,314 | 8/1985 | Ackley | 204/298.25 |
| 4,607,593 | 8/1986 | Van Hemel | 118/719 |
| 4,664,062 | 5/1987 | Kamohara et al. | 118/719 |
| 4,692,233 | 9/1980 | Casey | 204/298 |
| 4,709,655 | 12/1987 | Van Mastrigt | 118/719 |
| 4,795,299 | 1/1989 | Boys et al. | 414/217 |
| 4,824,545 | 3/1989 | Arnold et al. | 204/298 |

Primary Examiner—Richard Bueker
Attorney, Agent, or Firm—Stanley Z. Cole; Sheri M. Novack; Peter J. Sgarbossa

[57] ABSTRACT

Pre- and post-processing of a semiconductor wafer within a main vacuum chamber is accomplished by a wafer holder disposed within a clam shell-like device. The clam shell device includes a first member disposed above the wafer holder and a second member disposed below the wafer holder in a facing relationship to the first member. The first member and the second member each have a respective mating surface. The first member and the second member are movable between a closed position wherein the mating surface of each of the first member and second member hermetically engage each other in an open position. The clam shell device forms an interior chamber when in its closed position. Gases are evacuated from the interior chamber, exteriorally of the main chamber, when the clam shell device is in in a closed position to avoid contamination of the vacuum environment.

10 Claims, 3 Drawing Sheets

VACUUM VESSEL

FIELD OF THE INVENTION

The present invention relates generally to semiconductor wafer processing equipment, and more particularly to the vacuum vessel disposed within the main vacuum chamber which permits processing of the wafer without contamination of the main vacuum environment.

BACKGROUND OF THE INVENTION

In the processing of semiconductor wafers, it is highly desirable to perform multiple processing steps in a single piece of equipment. Presently, pre- and post-processing functions on the wafer are often done by removing the wafer from the vacuum environment. This is necessary since such pre- and post-processing steps require the wafer to be heated which expunges gases trapped at the surface of the wafer.

Some pre- and post-processing functions have been performed within the main vacuum chamber. However, the significant disadvantage and limitation of such prior art is that the vacuum quality of the semiconductor processing equipment is compromised by the contamination allowed within the main vacuum chamber. There have also been additional chambers added to the equipment to effect the pre- and post-processing functions. The significant disadvantage and limitation of such a system is that significant costs in through-put restrictions arise when using this type of isolation.

SUMMARY OF THE INVENTION

It is therefore an object of the present invention to provide a device which allows parallel operations within a vacuum chamber without cross-contamination. It is a further object of the present invention to provide such a device which does not detract from the through-put yet offers significant capability in savings and cost of processing.

According to the present invention, an apparatus to permit processing of a semiconductor wafer within a main vacuum chamber having a wafer holder disposed therein includes a clam shell-like device. The clam shell device includes a first member disposed above the wafer holder and a second member disposed below the wafer holder in a facing relationship to the first member. The first member and the second member each have a respective mating surface. The first member and the second member are movable between a closed position wherein the mating surface of each of the first member and second member hermetically engage each other in an open position. The clam shell device forms an interior chamber when in its closed position. The apparatus further includes means for evacuating gases from the interior chamber, exteriorally of the main chamber, when the clam shell device is in a closed position.

An advantage of the present invention is that multiple processing activities may take place within one vacuum chamber. The widespread use of smaller geometries on the semiconductor chip itself has demanded that all forms of contamination control be optimized. The clam shell device maintains the separation of gaseous contaminants between the clam shell interior and the rest of the main vacuum chamber. The clam shell device has a significant advantage in that it affects this isolation with extremely simple, reliable and low particulate mechanisms. Also, the mechanisms require a small amount of space which is conducive to being mounted within another vacuum chamber. The layout of the clam shell device permits sustained high through-put within the main vacuum chamber. This is an important advantage over the prior art in which separate adjoining chambers degrade through-put. The through-put considerations are a primary feature since the success of the very expensive semiconductor processing equipment is naturally measured against the number of wafers that can be processed within it.

These and other objections, advantages and features of the present invention will become readily apparent to those skilled in the art from a study of the following description of an exemplary preferred embodiment when read in conjunction with the attached drawings and appended claims.

DESCRIPTION OF AN EXEMPLARY PREFERRED EMBODIMENT

Figure 1:
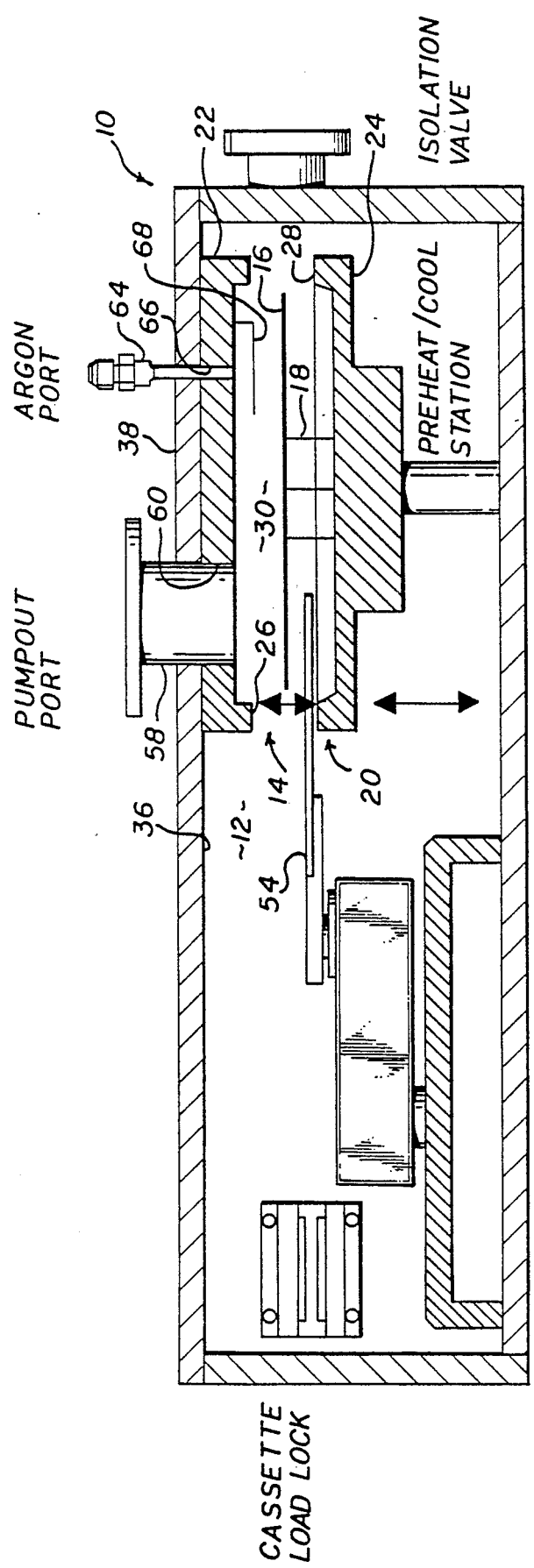
FIG. 1 is a schematic view of a main vacuum chamber incorporating the novel clam shell device of the present invention.

Referring now to the drawings, there is shown semiconductor processing equipment 10 having a main vacuum chamber 12. The processing equipment 10 includes an apparatus 14 to permit processing of the semiconductor wafer 16 within the main vacuum chamber 12 in accordance with the principles of the present invention.

Figure 2:
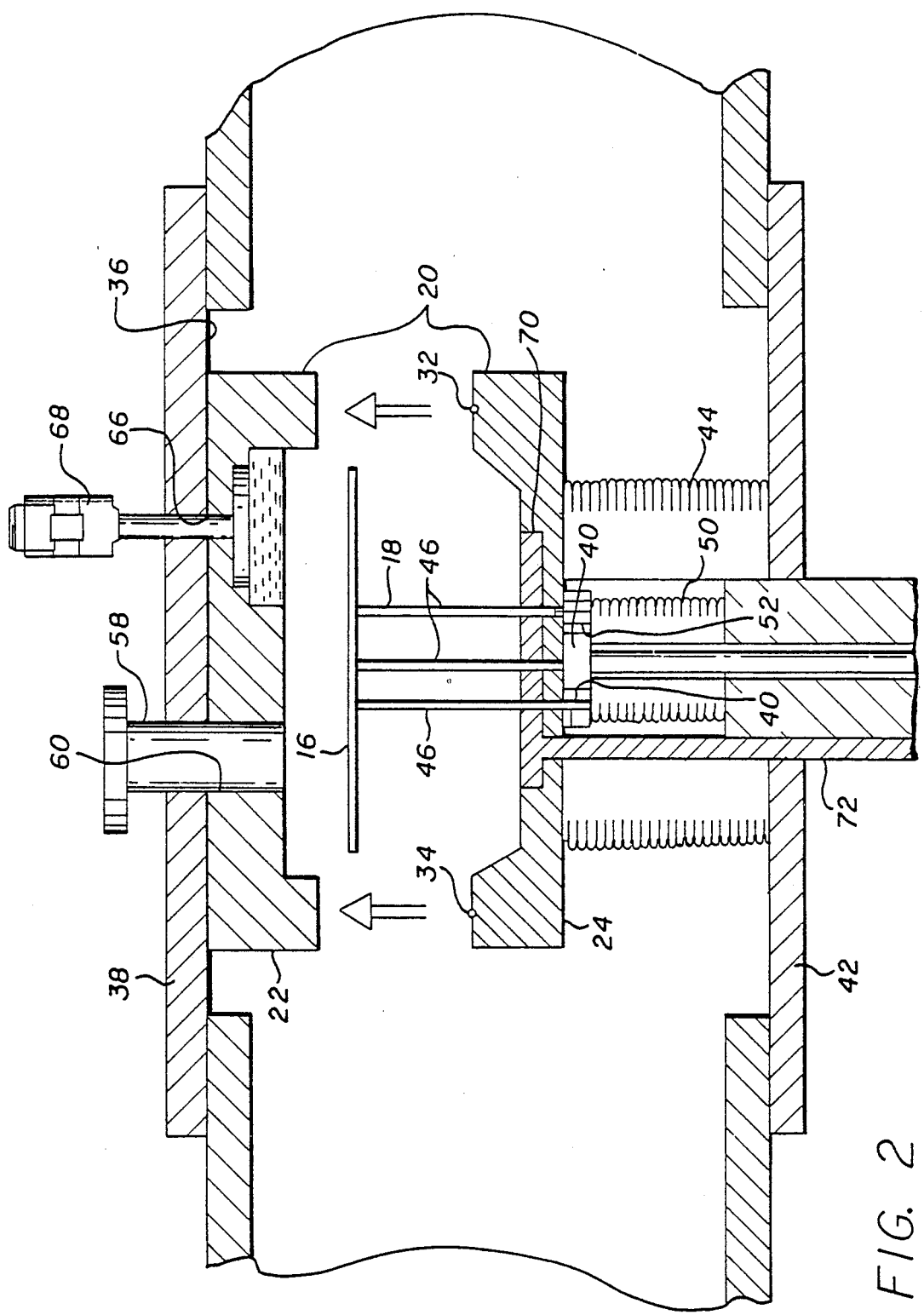
FIG. 2 is an enlarged view of the clam shell device of FIG. 1.
Figure 5:
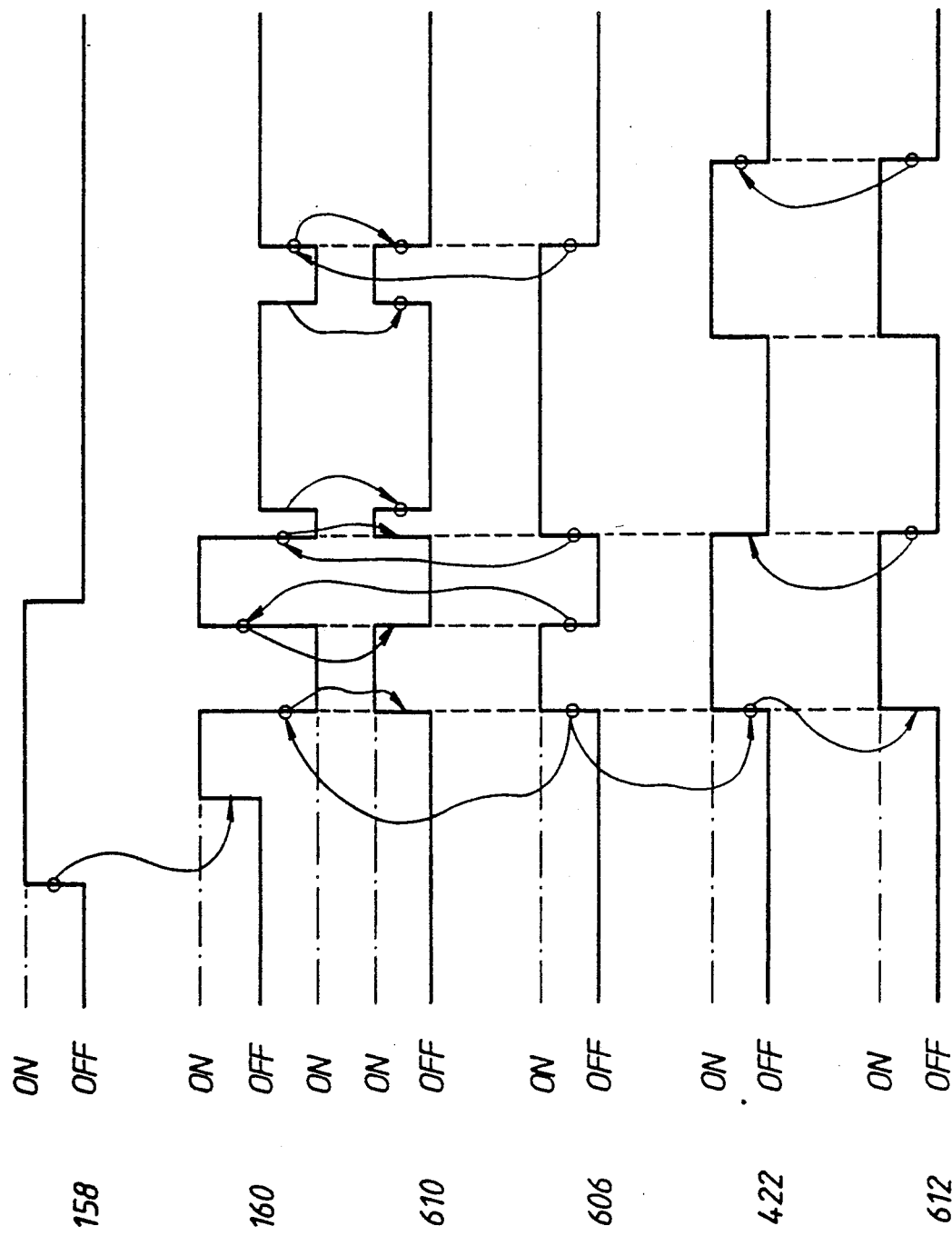

The novel apparatus 14 of the present invention includes a wafer holder 18 and a clam shell-like device 20. The clam shell device 20 includes a first member 22 and a second member 24. The first member 22 and the second member 24 are in a facing relationship to each other. The first member 22 has a mating surface 26 and the second member 24 has a corresponding mating surface 28. As will be described in greater detail hereinbelow, the first member and the second member are movable with respect to each other between an open position, as seen in FIG. 2, and a closed position (shown in the direction of the arrows) wherein the mating surface 26 of the first member 22 is hermetically engaged with the mating surface 28 of the second member 24. When the clam shell device 20 is in a closed position, an interior chamber 30 is formed therein.

As best seen in FIG. 2, the mating surface 28 of the second member 24 includes a channel 32. An O-ring 34 is disposed in the channel 32. When each mating surface 26, 28 are engaged together, the O-ring provides a hermetic seal. The seal need not be elastomeric as described herein, but may be a metal or a low conductance seal.

In one embodiment of the present invention, the first member 22 of the clam shell device 20 may be mounted to an interior surface 36 of an upper wall 38 of the semiconductor processing equipment 10. The second member 24 may then be mounted for relative movement with respect to the first member on a piston 40. The piston 40 extends through a lower wall 42 of the semiconductor processing equipment 10. The piston may be connected to any conventional form of external actuator, pneumatic, hydraulic, or electrical. A bellows 44 is sealingly engaged to the second member 24 and the lower wall 42. The bellows 44 prevents contaminants from entering the main vacuum chamber 12.

The wafer holder 18, in one embodiment of the present invention, is a plurality of pins 46. Three pins 46 may be used in a tripod arrangement. The pins 46 are received through bores 48 within the piston 40. The pins 46 may also be connected to a conventional type external actuator. Again, a bellows 50 is sealingly engaged between a bottom surface 52 of the piston 40 and lower wall 42. The bottom surface 52 also includes bores 53 through which the pins 46 are received.

Since the clam shell device 20 is within the main vacuum chamber 12, a load arm 54 is provided to load and unload wafers into the clam shell device 20. The clam shell device 20 is always open before the load operation takes place. The load operation is accomplished with the pins 46 raising the wafer 16 above the load arm 54. Once the wafer 16 is off the load arm 54, the load arm 54 retracts while the pins 46 remain in the raised position. The geometry of the load arm 54 must be such that the retraction can occur without interfering with the pins 46. The load arm 54 returns to retrieve the wafer 46 from the clam shell device 20 by following the opposite sequence of events.

Prior to entering the clam shell device 20, the pins 46 raise the wafer 16. Now the load arm 54 can extend into the clam shell device 20 without contacting the pins 46 or the wafer 16. When the load arm 54 has completed its extension, the pins 46 lower, thereby clearing the load arm 54 yet leaving the wafer 16 on the load arm 54. The load arm 54 is now free to continue moving the wafer 16 to its next destination with all of the events taking place in a vacuum environment within the main vacuum chamber 12.

Figure 3:
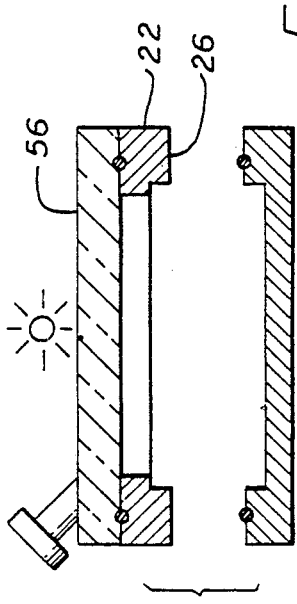
FIG. 3 illustrates an alternative embodiment of a portion of the clam shell device.

The clam shell device 20 is particularly adapted for two semiconductor process functions. The first function is a pre-process which involves heating the wafer 16 to de-gas impurities which may have formed on the surface of the wafer 16. With particular reference now to FIG. 3, an optically transparent window 56 may be hermetically sealed to the first member 22 so that optical radiation may be directed through the window 56 to heat the wafer 16. To evacuate the gases from the clam shell device 20 when closed, a fitting 58 is disposed in the first member 22 and through the upper wall 38. The fitting 58 has an opening 60 in communication with the interior chamber 30. The fitting 58 is adapted to be coupled to a vacuum pump (not shown) exterior of the main vacuum chamber 12.

A post-process action is required to cool the wafer within the closed clam shell device 20. To cool the wafer 16, the pins 46 are lowered with the clam shell device 20 closed so that the wafer 16 rests on a surface 62 of the second member 24. A second fitting 64 is disposed in the first member 22 through the upper wall 38 to introduce inert gas, such as argon, into the interior chamber 30. The gas is used as a coolant. Excess gas, of course, may be evacuated through the fitting 58. The fitting 64 also has an opening 66 in communication with the interior chamber 30. The fitting being adapted to be coupled to a source of (not shown) gas external from the main vacuum chamber 12. To disperse the gas, a baffle 68 may be disposed in the interior chamber 30 proximate the opening 66 to disperse the gas introduced therein.

To further cool the wafer 16, the second member 24 may also include a water jacket 70 through which a coolant may be pumped. The water jacket 70 is coupled to a conduit 72 to a source (not shown) of coolant external of the main vacuum chamber 12. At the conclusion of the gas conduction cooling process, the gas is pumped out of the clam shell. When the interior of the clam shell 20 is at an appropriate pressure, it opens up inside the main vacuum chamber 12 and the wafer 16 is removed.

There has been described hereinabove apparatus for permitting processing functions on a semiconductor wafer without contamination of the main vacuum chamber. Those skilled in the art may now make numerous uses of and departures from the above-described exemplary preferred embodiment without departing from the inventive concepts disclosed herein. Accordingly, the present invention is to be defined solely by the scope of the following claims.

I claim:

1. An apparatus to permit processing of a semiconductor wafer within a main vacuum chamber, said apparatus comprising a main vacuum chamber;

a wafer holder;

a clam shell device including a first member disposed above said wafer holder and a second member disposed below said wafer holder in a facing relationship to said first member, said first member and said second member each having a respective mating surface, said first member and said second member being movable between an open position and a closed position wherein said mating surface of said first member is hermetically engaged with said mating surface of said second member, said clam shell device forming an interior chamber located inside of and sealed from the main chamber when in said closed position; and means for evacuating gases from said interior chamber exteriorally of said main chamber when said clam shell device is in a closed position.

2. An apparatus as set forth in claim 1 wherein said mating surface of one of said first member and said second member includes a channel and an O-ring disposed in said channel.

3. An apparatus as set forth in claim 1 further comprising:

means for cooling said wafer when said clam shell device is in a closed position.

4. An apparatus as set forth in claim 3 wherein said cooling means includes:

means for positioning said wafer holder within said interior chamber so that said wafer contacts an interior face of said second member; and means for introducing a coolant within said second member.

5. An apparatus as set forth in claim 3 wherein said cooling means includes:

means for introducing a gas into said interior chamber when said clam shell device is in said closed position, said gas being evacuated by said evacuating means.

6. An apparatus as set forth in claim 5 wherein said introducing means includes:

a fitting disposed in said first member and having an opening in communication with said interior chamber, said fitting being adapted to be coupled to a source of gas external of said vacuum chamber.

7. An apparatus as set forth in claim 6 wherein said introducing means further includes a baffle disposed in said interior chamber proximate said opening to disperse said gas introduced into said interior chamber.

8. An apparatus as set forth in claim 1 wherein said first member includes:

an optically transparent window hermetically sealed therein such that optical radiation may be directed through said window to heat said wafer.

9. An apparatus as set forth in claim 1 wherein said evacuating means includes:

a fitting disposed in said first member and having an opening in communication with said interior chamber, said fitting being adapted to be coupled to a vacuum pump exterior of said vacuum chamber.

10. An apparatus as set forth in claim 1 wherein said wafer holder includes:

a plurality of upright pins;

a plurality of openings disposed through said second member, each of said pins being disposed in one of said openings, said pins being slidable between a raised position and a lowered position, said wafer being in contact with said second member when said pins are in said lowered position.

* * * * *